(12) United States Patent
Hsu et al.

(10) Patent No.: US 6,407,368 B1
(45) Date of Patent: Jun. 18, 2002

(54) SYSTEM FOR MAINTAINING A FLAT ZONE TEMPERATURE PROFILE IN LP VERTICAL FURNACE

(75) Inventors: Chun-Keng Hsu, Kuan-Yin Hsin; Chun-Chih Lin; Chao-Lin Lee, both of Taipei; Sung-Chieh Lin, Yunlin, all of (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/904,362

(22) Filed: Jul. 12, 2001

(51) Int. Cl.[7] .................................................. F27B 5/14
(52) U.S. Cl. ..................... 219/390; 219/405; 219/411; 392/416; 118/724; 118/725; 118/50.1
(58) Field of Search ................................. 219/390, 405, 219/411; 392/416, 418; 118/724, 725, 50.1, 728

(56) References Cited

U.S. PATENT DOCUMENTS 5,482,558 A * 1/1996 Watanabe et al. ........... 118/728
5,622,639 A * 4/1997 Kitayama et al. ........... 219/390

* cited by examiner

Primary Examiner—Teresa Walberg
Assistant Examiner—Shawntina Fuqua
(74) Attorney, Agent, or Firm—Tung & Associates

(57) ABSTRACT

A thermal reactor has a processing tube with a multiple-walled inner chamber. The geometry of the multiple-walled inner chamber having flow passageways between the walls, directs the flow of heat to the wafers loaded in the wafer boats for maintaining a flat zone temperature profile. The thermal budget, TB, which is a function of time and temperature, at each vertical zone in the processing tube is substantially equal in all zones.

13 Claims, 2 Drawing Sheets

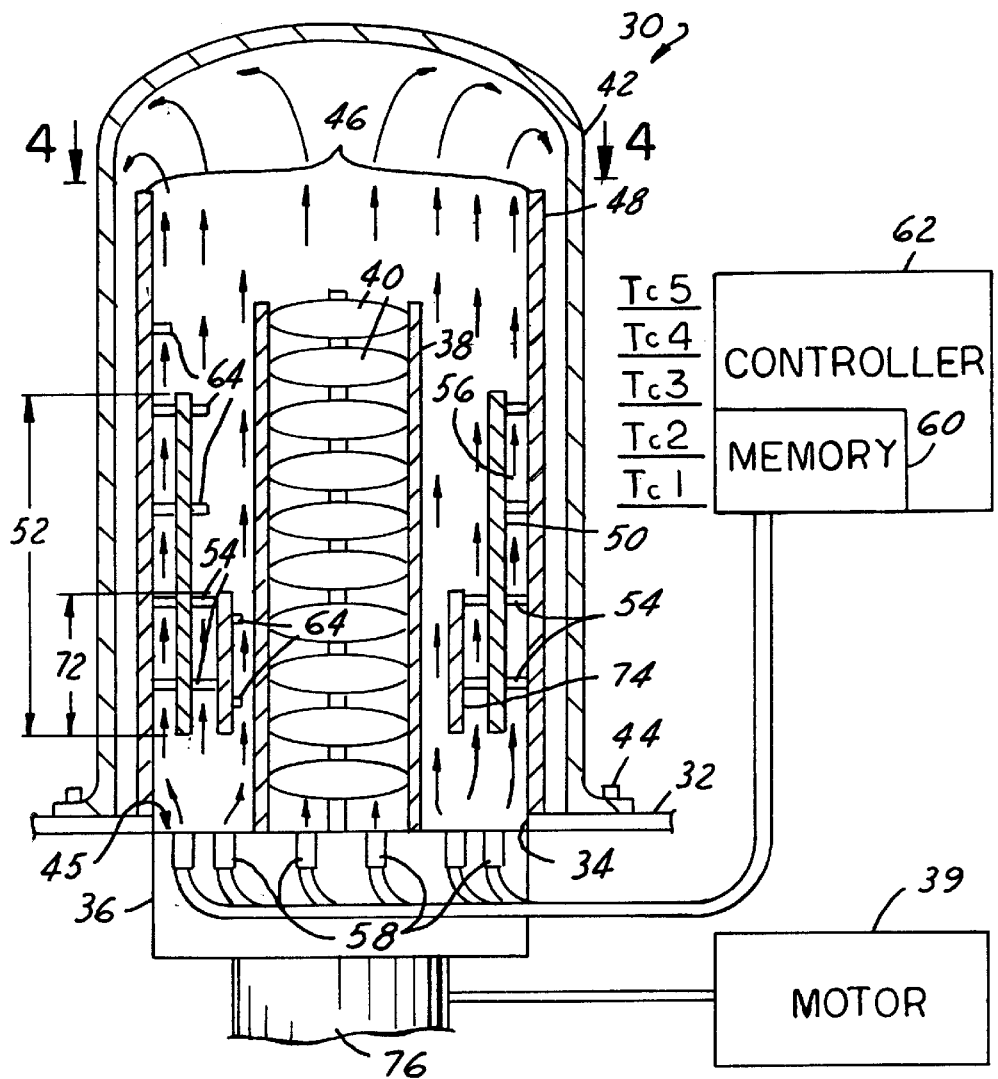
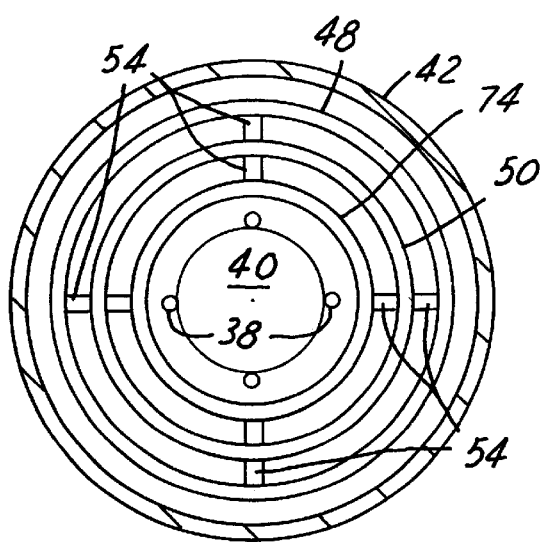
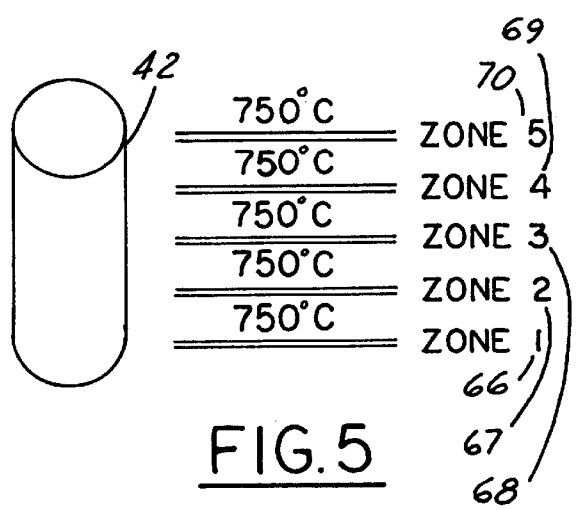
FIG. 3
FIG. 4
FIG. 5

SYSTEM FOR MAINTAINING A FLAT ZONE TEMPERATURE PROFILE IN LP VERTICAL FURNACE

BACKGROUND OF THE INVENTION

1. Field of the Invention

The present invention broadly relates to equipment for manufacturing semiconductor devices, such as integrated circuits, and deals more particularly with maintaining a flat temperature profile at all levels of a low-pressure vertical furnace.

2. Description of the Related Art

In connection with processes used to manufacture semiconductor deices, such as integrated circuits, numerous process steps are carried out in a controlled environment at elevated temperatures. Such processes include oxidation, diffusion, chemical vapor deposition and annealing. In order to realize elevated processing temperatures, semiconductor wafers are processed in an evacuation chamber, typically in a form of a quartz tube that is housed within a semiconductor furnace.

The most common type of semiconductor furnaces is the so-called "hot wall" electric type that facilitates batch processing of semiconductor wafers. Furthermore, hot wall electric furnaces exhibit excellent temperature stability and precise temperature control. Modern hot wall diffusion furnaces are capable of controlling temperatures over the range of 300° C. to 1200° C.

The processing of semiconductor wafers and other microelectronic components has become of great economic significance due to the large volume of such circuits and components being produced and the significant value associated with them. Competitive pressures have driven dramatic changes in production. Among the most dramatic changes is the reduction in size of the various features of the circuits and components that make up the transistors and other devices being formed. This reduction in feature size has been driven by the need to achieve greater levels of integration, more sophisticated and complex circuits, and reduction in production costs by, for example, obtaining more circuits on each semiconductor wafer or other substrate being processed.

Even though feature sizes used in integrated circuits and other microelectronic components have decreased dramatically, additional reductions are continuously being pursued. As feature size decreases, the importance of accurate temperature control during processing increases to even a greater degree. The temperature at which semiconductor wafers and other substrates are processed has a first order effect on the diffusion of dopants, deposition of materials or other thermal processes being performed. Thus, it is important to have processing equipment that can achieve accurate temperature control to meet desired thermal processing specifications.

Various temperature control problems must be addressed by a thermal process control system if it is to meet the increasingly stringent requirements of the microelectronic circuit manufacturing industry. For example, each wafer in a batch should be subject to the same temperature conditions over the entire thermal processing cycle. Left uncontrolled, temperature variations occur between the wafers positioned near the ends of an array of wafers held within the processing furnace when compared to the wafers disposed at mid-portions of the furnace. There may also be other less predictable variations from wafer to wafer, such as along the array of wafers contained within the processing array.

A still further temperature control problem is associated with temperature variations that occur across the width of an individual wafer or other workpiece being processed. Heat from heating elements disposed about peripheral edges of the work pieces is radiated through the processing vessel. Variations can occur with regard to the heat gain experienced by the peripheral edges of the wafer as compared to the interior areas of the wafer. Variations in the degree of radiant heat transfer and radiant shadowing, which occurs from wafer to wafer further, exacerbates this intra-wafer problem.

A tilted temperature profile from 770° C. to 730° C. from the top of the furnace to the bottom of the furnace is an intrinsic characteristic of LP vertical furnaces. Top and bottom refer to the boat stack with the bottom being nearest the source of heat. This characteristic is due to the loading effect and reaction gas depletion at the top site close to the pumping line.

Reaction gas depletion at the top site is due to the confinement of the bottom site injector arrangement near the pedestal.

Some devices with gate implant (N+/P+) after gate poly deposition are very sensitive to the following low-pressure furnace thermal process, such as spacer deposition, because of the further thermal-drive dopant. U.S. Pat. No. 6,214,715B1, entitled "Method for Fabricating a Self Aligned Contact Which Eliminates the Key Hole Problem Using a Two Step Spacer Deposition" issued on Apr. 10, 2001 to a common assignee describes a two-step spacer deposition and is incorporated herein by reference.

Another problem with the tilted temperature profile in these furnaces, causes the VTP/N, (Vapor Transfer Polymerization) or other parameters variation on products experiencing different thermal budget at different boat positions is the furnace.

U.S. Pat. No. 6,168,427B1 entitled "Apparatus for Guiding the Removal of a Processing Tube from a Semiconductor Furnace" issued on Jan. 2, 2001 and assigned to a common assignee, teaches an apparatus for removing the quartz tube from the furnace for routine maintenance. This apparatus facilitates the removal of the quartz tube from the furnace that precludes or substantially reduces the possibility of the tube coming in contact with the sidewalls of the furnace during the removal process.

It is an advantage of the present invention to maintain a uniform temperature profile along the height of the boat support in the vertical furnace.

It is a further advantage of the present invention to reduce wafer scrap due to temperature variations during the processes performed in the semiconductor furnace.

It is still a further advantage of the present invention to increase the capacity of the furnace by allowing more boat positions in the furnace.

These and other advantages will become apparent in the following drawings and detailed description of the preferred embodiment.

SUMMARY OF THE INVENTION

A system for maintains a flat zone temperature profile in a low-pressure vertical furnace for a temperature-sensitive process, the system having a platform with a central aperture. A pedestal adapted to extend through the central aperture having at least one wafer boat axially mounted thereon.

A processing tube having an open end mounted on the platform surrounding the central aperture.

A multiple wall inner tube having a first inner tube is mounted within the outer bell and spaced therefrom. The first inner tube extends from the platform to proximately the enclosed end of the processing tube. A second inner tube is mounted in a radially spaced relationship within the first inner tube. Again the spacing is on the order of millimeters. The second inner tube extends a predetermined height in the first inner tube.

A plurality of spacers are positioned between the first and second inner tubes forming an unitary or integral structure. The spacers maintaining the tubes radially spaced apart to provide flow passageways between the first and second inner tubes. The multiple wall inner tube has an internal diameter adapted to receive at least one wafer boat.

A plurality of igniters substantially equally spaced on the pedestal and adapted to supply heat to the passageways and the inner diameter of the second inner tube.

A controller operatively connected to the igniters and is responsive to a predetermined temperature profile for maintaining the temperature of heat from the igniters surrounding the boats.

BRIEF DESCRIPTION OF THE DRAWINGS

In the drawings,

FIG. 3 is a bell chamber enclosing a multiple wall furnace chamber according to the present invention;

FIG. 4 is a sectional view along line 4—4 of FIG. 3; and

FIG. 5 is a flat temperature chart of the multiple wall furnace chamber of FIG. 3.

DETAILED DESCRIPTION OF THE PREFERRED EMBODIMENT

Figure 1:
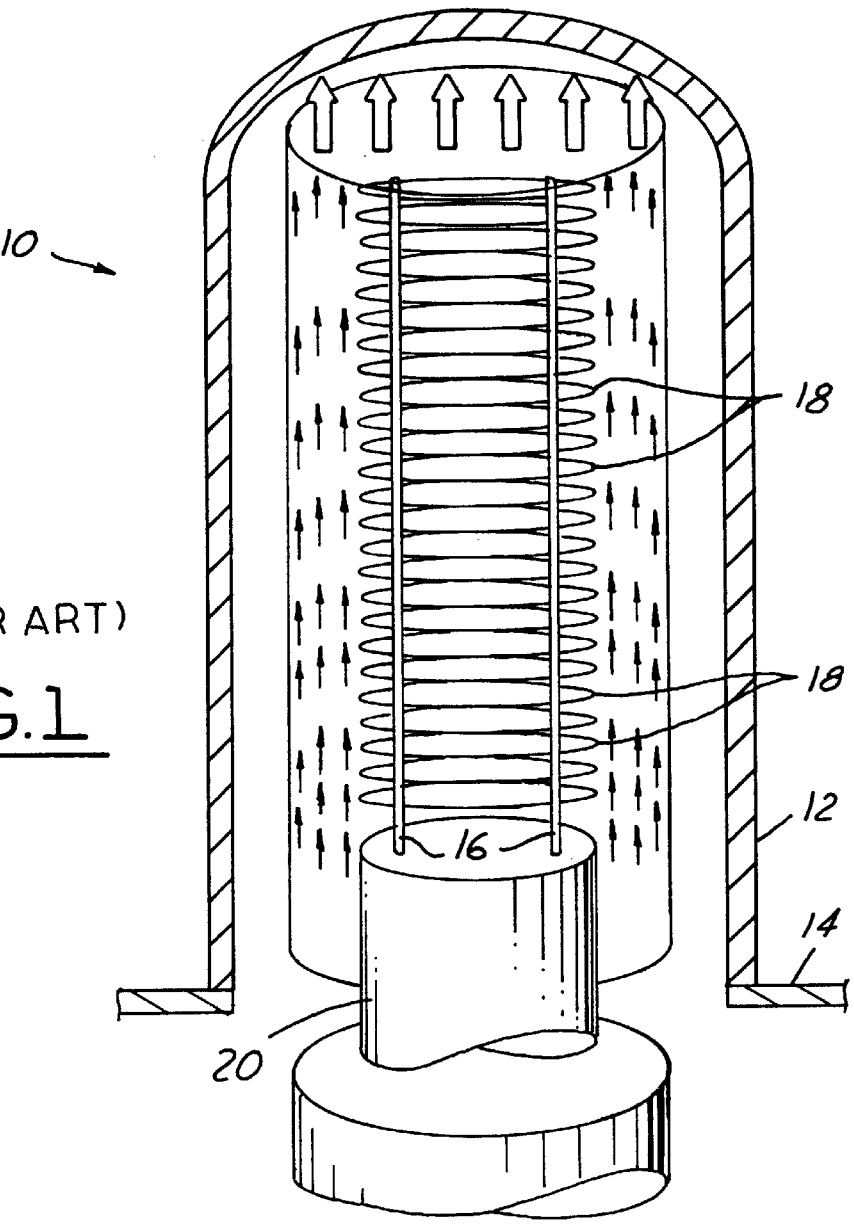
FIG. 1 a bell chamber enclosing a single wall furnace chamber.

Referring to the Figs by the characters of reference there is illustrated in FIG. 1, a single wall furnace chamber 10 of the prior art. A processing tube 12, typically in the shape of a bell tube, is mounted on a platform 14 containing a wafer boat 16 loaded with wafers 18 mounted on a pedestal 20. The wafer boat 16 is axially located in the processing tube 12. Heat is supplied from the bottom and it flows toward the enclosed end of the processing tube 12 to supply heat and/or various gases to operate the semiconductor fabrication process.

Figure 2:
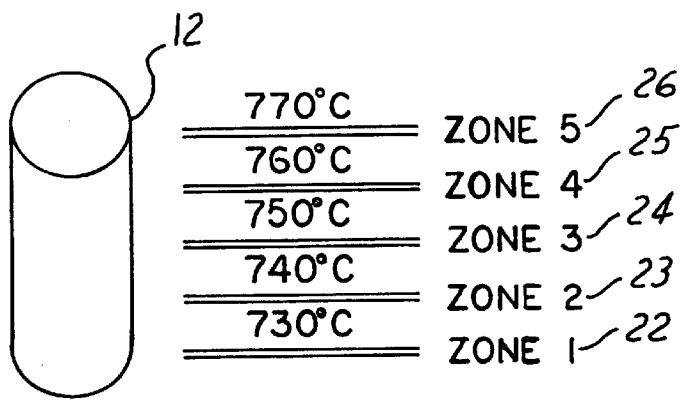
FIG. 2 is a tilted temperature chart of the furnace chamber of FIG. 1.

FIG. 2 illustrates the typical temperature profile of the system of FIG. 1. The interior of the processing tube 12 is, for purposes of illustration, divided into five temperature zones 22–26. The fifth temperature zone 26 is located near the top of the enclosed end of the bell tube 12 and the first zone 22 is located near the bottom. As illustrated, as the heat rises, so does the temperature. In the example, the temperature range from the first zone 22 to the fifth zone 26 ranges from 730° C. to 770° C. Such a range may be detrimental some processes. Stated another way:

$$T_{Zone5} > T_{Zone4} > T_{Zone3} > T_{Zone2} > T_{Zone\,1}$$

or $$TB_{Zone5} > TB_{Zone4} > TB_{Zone3} > TB_{Zone2} > TB_{Zone1}$$

and since Thermal Budget (TB) is a function of temperature and time, the TB of the first zone 22 is less than the TB of the fifth zone 26. Such a system is difficult to control.

Referring to FIG. 3 there is illustrated a system 30 for maintaining a flat zone temperature profile in a low-pressure vertical furnace for a temperature-sensitive process. The system has a platform 32 with a central aperture 34. Located in the central aperture 34 is a pedestal 36 that is adapted to extend through the central aperture 34. The pedestal 36 is mounted for reciprocal movement and is driven by a motor 39 as is well known in the art. The pedestal 36 has at least one wafer boat 38 loaded with wafers 40 axially mounted thereon that is controllably moved in and out of the processing tube 42. The processing tube 42 is mounted on the platform 32 by means of fasteners 45. Only the part of the furnace that is part of the present invention is illustrated.

One such furnace is described in U.S. Pat. No. 5,846,073 entitled "Semiconductor Furnace Processing Vessel Base" issued on Dec. 8, 1998 and is incorporated herein by reference.

A processing tube or bell tube 42, having an open end 45 is mounted on the platform 32 and surrounds the central aperture 34. U.S. Pat. No. 6,168,427B1 entitled "Apparatus for Guiding the Removal of a Processing Tube from a Semiconductor Furnace" issued on Jan. 2, 2001 and assigned to a common assignee, teaches an apparatus for removing such a quartz processing tube 42 from the furnace for routine maintenance. This patent is incorporated herein by reference.

A multiple wall inner tube 46 having a first inner tube 48 is mounted within the processing tube 42 and spaced therefrom. FIG. 3 illustrates a large space between the walls of the processing tube 42 and the first inner tube 48 while in fact such space is on the order of millimeters.

The first inner tube 48 extends from the platform 32 to proximately the enclosed end of the processing tube 42. A second inner tube 50 is mounted in a radially spaced relationship within the first inner tube 48. Again the spacing is on the order of millimeters. The second inner tube 50 extends from a location spaced from the platform 32 to a predetermined height 52 in the first inner tube 48. The second inner tube 50 has an internal diameter adapted to receive at least one wafer boat 38 loaded 20 with wafers 40.

FIG. 4 is a section taken through line 4—4 of FIG. 3 and illustrates the plurality of spacers 54 between the first 48 and second 50 inner tubes forming an unitary or integral multiple-wall inner tube structure 46. The spacers 54 maintain the tubes radially spaced apart to provide flow passageways 56 between the first 48 and second 50 inner tubes. The multiple wall inner tube 46 has an internal diameter adapted to receive at least one wafer boat 38.

Pluralities of igniters 58 or heat sources are equally spaced on the pedestal 36. The igniters 58 are adapted to supply heat to the passageways 56 and the inner diameter of the multiple-wall inner tube 46. The output temperature of the heat sources is controlled according to a predetermined recipe located in the memory 60 of the controller 62.

The controller 62 is operatively connected to the igniters 58. The controller can be operated from a microprocessor in a manner that is well known in the art or may be manually operated by an operator. An example of such a controller is shown in U.S. Pat. No. 6,207,937 B1 issued on Mar. 2, 2001 and entitled "Temperature Control System for a Thermal Reactor" that is incorporated herein by reference.

In the present invention, the recipe contained in the memory 60 of the controller 62 responds to a plurality of temperature sensors 64 or thermocouples in the processing tube 42. The temperature sensors 64 are axially spaced within the processing tube for sensing the temperature at various axial locations. The controller compares the sensed temperature with the predetermined temperature profile stored in the memory for maintaining the temperature is the axial locations.

As illustrated in FIG. 3, the temperature sensors 64 are operatively positioned on the inside surface of each wall 48–50 that is not shadowed by another inner wall. Illustrated are five temperature sensors 64, although more or less sensors may be used in each zone for control reading purposes.

The recipe includes a program for a predetermined temperature profile to maintain the temperature of heat engulfing the boats 38.

FIG. 5 illustrates the typical temperature profile of the system of FIG. 3. The interior of the processing tube 42 is, for purposes of illustration, divided into five temperature zones 66–70. The fifth temperature zone 70 is located near the top of the enclosed end of the bell tube 42 and the first zone 66 is located near the bottom. According to the present invention and in a particular operation, the temperature range from the first zone 66 to the fifth zone 70 is constant or flat at 750° C. Stated another way:

$$T_{Zone5} = T_{Zone4} = T_{Zone3} = T_{Zone2} = T_{Zone1}$$

and since Thermal Budget (TB) is a function of temperature and time, $$TB_{Zone5} = TB_{Zone4} = TB_{Zone3} = TB_{Zone2} = TB_{Zone1}$$

the TB of the first zone 66 the TB of the fifth zone 70 is flat. This is a flat zone temperature profile and the temperature at each boat 38 is substantially identical creating a flat zone temperature characteristic.

In the embodiments of the present invention the predetermined height 52,74 decreases from the first inner tube 48 as the number of inner walls increases. Thus, in one embodiment the multiple-wall inner tube 46 has just two walls 48, 50. The second or innermost wall 50 is between forty and seventy percent of the height of the first inner wall 48. The heat flows along both side of the second or innermost wall 50. In the embodiment as illustrated in FIG. 3, the multiple-wall inner tube 46 has three walls 48, 50, 74. The second or middle wall 50 is between fifty and eighty percent of the height of the first inner wall 48 and the third or innermost wall 74 is between twenty and forty percent of the height of the first inner wall 48.

The present invention additionally includes an elevator 76 connected to the pedestal 36 for reciprocally moving the wafer boats 38 in the innermost diameter of the integral structure 46. The wafer boats 38 are mounted on the pedestal 36 and the wafers 40 to be processed are loaded in the wafer boats. The wafer boats 38 and their loading are well known in the art and are not part of the present invention.

There has thus been illustrated a thermal reactor system 30 having a multiple-wall inner tubular chamber 46 for directing the flow of heat or gases uniformly along the height of the processing tube 42. If the flow is heat, the temperature budget for each vertical zone 66–70 is substantially identical. In normal use, the multiple-wall inner tubular chamber 46 remains within the processing tube 42 as the wafer boats 38 are removed and reinserted. Examples of two and three inner walls are shown with spacers 54 supporting the second 50 and third 74 inner walls on the first or outermost inner wall 48. The bottom edge of the innermost walls is spaced from the platform 32 and each extends a predetermined height 52, 72 into the processing tube 42.

Accordingly, various changes and modifications may be made to the illustrative embodiment without departing from the spirit or scope of the invention. It is intended that the scope of the invention not be limited in any way to the illustrative embodiment shown and described but that the invention be limited only by claims appended hereto.

What is claimed is:

1. A system for maintaining a flat zone temperature profile in a low pressure vertical furnace for a temperature-sensitive process, the system comprising:
   a platform having a central aperture;
   a pedestal adapted to extend through said central aperture;
   at least one wafer boat axially mounted on said pedestal, said wafer boat loaded with wafers to be processed;
   a processing tube having an open end mounted on said platform surrounding said central aperture;
   a first inner tube within said outer bell and spaced therefrom, said first inner tube extending from said platform to proximately the enclosed end of said processing tube;
   a second inner tube within said first inner tube, said second inner tube extending a predetermined height in said first inner tube, said predetermined height is between forty and seventy percent of the height of said first inner tube, said second inner tube having an internal diameter adapted to receive said at least one wafer boat;
   a plurality of spacers between said first and second tubes forming an unitary structure for maintaining said tubes spaced apart providing flow passageways between said first and second inner tubes;
   a plurality of igniters substantially equally spaced on said pedestal and adapted to supply heat to said passageways and the inner diameter of said second inner tube; and
   a controller operatively connected to said igniters and responsive to a predetermined temperature profile for maintaining a flat zone temperature profile in said processing tube.

2. The system according to claim 1 wherein said integral structure has at least two inner walls.

3. The system according to claim 1 additionally including one or more temperature sensors axially spaced within said processing tube for sensing the temperature at various axial locations in said inner diameter and operatively connected to said controller.

4. The system according to claim 3 wherein said controller compares the sensed temperature with said predetermined temperature profile for maintaining the temperature in said axial locations.

5. The system according to claim 1 wherein the temperature at each boat is substantially identical.

6. The system according to claim 1 additionally including an elevator connected to said pedestal for reciprocally moving said at least one wafer boat on said pedestal in said inner diameter of said unitary structure.

7. A system for maintaining a flat zone temperature profile in a vertical furnace for a temperature-sensitive process, the system comprising:
   a platform having a central aperture;
   a pedestal adapted to reciprocate through said aperture;
   at least one wafer boat axially mounted on said pedestal, said wafer boat loaded with wafers to be processed;
   a bell shaped processing tube having an open end mounted on said platform surrounding said central aperture;
   a first inner tube within said processing tube and spaced therefrom, said first inner tube mounted on said platform and extending to proximate the enclosed end of said processing tube, said first inner tube having an internal diameter substantially the same as said central aperture and adapted to receive said pedestal;

a second inner tube within said first inner tube, said second inner tube having one end spaced from said pedestal and the other end extending a first predetermined height in said first inner tube;

a third inner tube within said second inner tube, said third inner tube having one end spaced from said pedestal and the other end extending a second predetermined height in said second inner tube, said third inner tube having an internal diameter adapted to receive said at least one wafer boat;

a plurality of spacers between each of said inner tubes for connecting said tubes as an unitary structure maintaining said tubes spaced apart providing flow passageways between said inner tubes;

a plurality of igniters substantially equally spaced on said pedestal and adapted to supply heat to said passageways and to the inner diameter of said third inner tube; and a controller operatively connected to said igniters and responsive to a predetermined temperature profile for maintaining a flat zone temperature profile in said processing tube and surrounding said wafer boat.

8. The system according to claim 7 wherein said first predetermined height is between fifty and eighty percent of the height of said first inner tube.

9. The system according to claim 7 wherein said second predetermined height is between twenty and forty percent of the height of said first inner tube.

10. The system according to claim 7 additionally including one or more temperature sensors axially spaced within said processing tube for sensing the temperature at various axial locations in said inner diameter and operatively connected to said controller.

11. The system according to claim 10 wherein said controller compares the sensed temperature with said predetermined temperature profile for maintaining the temperature is said axial locations.

12. The system according to claim 11 wherein the temperature at each wafer on said at least one wafer boat is substantially identical.

13. The system according to claim 7 additionally including an elevator connected to said pedestal for reciprocally moving said at least one wafer boat on said pedestal in said inner diameter of said unitary structure.

* * * * *